(12) United States Patent
Snider et al.

(10) Patent No.: US 9,525,418 B2
(45) Date of Patent: Dec. 20, 2016

(54) DYNAMIC FAIL-SAFE BIASING CIRCUITRY FOR FAULT-TOLERANT APPLICATIONS

(71) Applicant: Honeywell International Inc., Morristown, NJ (US)

(72) Inventors: Daniel Walter Snider, Tampa, FL (US); Malmaruhan Sivaprakasam, Tampa, FL (US); Jeremy S. Parks, Seminole, FL (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/673,542

(22) Filed: Mar. 30, 2015

(65) Prior Publication Data

US 2016/0294389 A1   Oct. 6, 2016

(51) Int. Cl.
*H03K 19/007* (2006.01)
*H03K 3/011* (2006.01)

(52) U.S. Cl.
CPC ............ *H03K 19/007* (2013.01); *H03K 3/011* (2013.01)

(58) Field of Classification Search
CPC .................... H03K 19/0361; H03K 19/018507
USPC ... 327/63, 530, 545, 546; 326/30, 34, 21–24
See application file for complete search history.

(56) References Cited

U.S. PATENT DOCUMENTS

| | | | | | |
|---|---|---|---|---|---|
| 3,582,718 | A | * | 6/1971 | Spellman | H01H 47/04 323/312 |
| 4,947,406 | A | * | 8/1990 | Yokoyama | H04L 25/08 326/14 |
| 6,124,727 | A | * | 9/2000 | Bridgewater, Jr. | H04L 25/0272 326/30 |
| 6,188,271 | B1 | * | 2/2001 | Wang | G06F 13/4072 327/530 |
| 6,320,406 | B1 | | 11/2001 | Morgan et al. | |
| 6,525,559 | B1 | | 2/2003 | Wu et al. | |
| 7,245,154 | B1 | | 7/2007 | Davidson et al. | |
| 7,474,133 | B1 | | 1/2009 | Aude et al. | |
| 7,477,077 | B1 | | 1/2009 | Aude et al. | |

OTHER PUBLICATIONS

European Patent Office, "Extended European Search Report from EP Application No. 16152848.4 mailed Jul. 26, 2016", "fro Foreign Counterpart of U.S. Appl. No. 14/673,542", Jul. 26, 2016, pp. 1-10, Published in: EP.
Clark, "Mospower fets as constant sources and sinks", Nov. 1, 1977, pp. 35, vol. 49, No. 599, Publisher: Electronic Engineering.

(Continued)

*Primary Examiner* — Dinh T Le
(74) *Attorney, Agent, or Firm* — Fogg & Powers LLC

(57) ABSTRACT

A biasing circuit includes a differential communication line comprising a first signal line and a second signal line. The biasing circuit further includes a first current source coupled between a power supply and the first signal line. The biasing circuit further includes a first high-precision voltage reference coupled to the first current source, wherein the first high-precision voltage reference outputs a reference voltage that drives a current produced by the first current source. The biasing circuit further includes a second current source coupled to the second signal line and a system ground, wherein the second current source is driven by a voltage supplied by the power supply.

20 Claims, 5 Drawing Sheets

(56) References Cited

OTHER PUBLICATIONS

Goldie, "FAILSAFE Biasing of Differential Buses", Jul. 1, 1992, pp. 1-6, Publisher: National Semiconductor Corporation.
Stitt, "Implementation and Applications of Current Sources and Current Receivers", Mar. 1, 1990, pp. 1-30, Publisher: Burr-Brown Corporation, Published in: US.

* cited by examiner

DYNAMIC FAIL-SAFE BIASING CIRCUITRY FOR FAULT-TOLERANT APPLICATIONS

STATEMENT REGARDING FEDERALLY SPONSORED RESEARCH OR DEVELOPMENT

This invention was made with Government support. The Government has certain rights in the invention.

BACKGROUND

Signaling interfaces that transmit across long cables between electronic hardware (e.g., low-voltage differential signaling (LVDS)) are susceptible to noise when not actively driven. In some situations, when a signaling interface is inactive (i.e., undriven), noise or cross-talk couples onto the cable of the inactive interface and can make it appear as though the inactive interface is active. When this occurs, the receiver can switch autonomously, causing undesirable results. This problem is particularly present in high-reliability, cross-strapped systems where the primary and redundant driver interfaces are not powered at the same time, but the primary and redundant receivers are powered.

Fail-safe bias resistors have been added to the signal lines in order to keep the input of the receiver at one level and prevent floating due to noise. Typically, these resistors are included in the input of the receiver and are connected to a power supply and ground. For differential signals, the high side is pulled up to the level of the power supply and the low side is pulled down. In some applications, particularly cross-strapped systems, the bias resistors are too weak to overcome the significant noise that may couple onto a long cable. If the resistors are made stronger to compensate for this, often the drivers cannot overcome the biasing current, which can affect the normal operation of the interface when biasing is not needed.

For the reasons stated above and for other reasons stated below which will become apparent to those skilled in the art upon reading and understanding the specification, there is a need in the art for improved systems and methods for dynamic fail-safe biasing circuitry for fault-tolerant applications.

SUMMARY

The Embodiments of the present invention provide methods and systems for a dynamic fail-safe biasing circuit and will be understood by reading and studying the following specification.

In one embodiment, a biasing circuit comprises: a differential communication line comprising a first signal line and a second signal line; a first current source coupled between a power supply and the first signal line; a first high-precision voltage reference coupled to the first current source, wherein the first high-precision voltage reference outputs a reference voltage that drives a current produced by the first current source; and a second current source coupled to the second signal line and a system ground, wherein the second current source is driven by a voltage supplied by the power supply.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
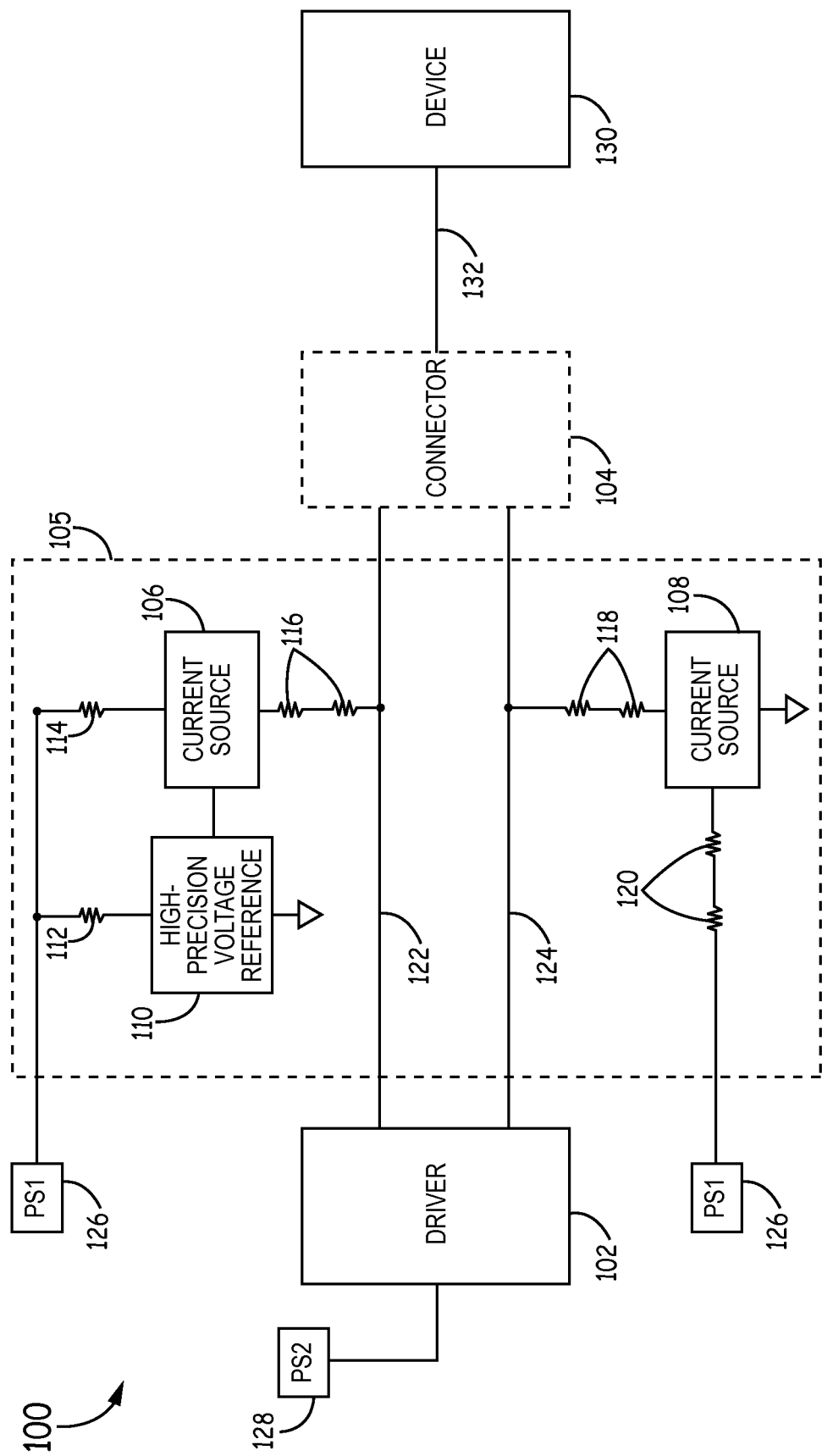
FIG. 1 is a block diagram illustrating an example differential communication system according to one embodiment of the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Optimally, a fail-safe biasing circuit for a differential communication system should be enabled when the driver is inactive, and should be disabled when the driver is active. These characteristics prevent the fail-safe biasing circuit from interfering with the performance of the driver, which is a problem with using bias resistors that are too powerful. Further, the fail-safe biasing circuit should provide enough noise margin so any noise or cross-talk that couples onto the cables does not result in autonomous switching at the receiver or other undesirable results. Previous fail-safe bias circuits did not accomplish these optimal qualities.

The embodiments described below provide systems and methods for a dynamic fail-safe biasing circuit for fault-tolerant applications. The embodiments described below include current sources connected to a power supply and the signal lines to provide a consistent current and voltage to inactive differential communication lines. Further, the embodiments described below include mechanisms for ensuring that the biasing circuit does not interfere with normal operation of the differential communication system.

FIG. 1 is a block diagram illustrating an example differential communication system 100 according to one embodiment of the present disclosure. System 100 includes a driver 102 (for example, a differential signal driver) coupled to an optional connector 104, a biasing circuit 105, a first power supply (PS1) 126, and a second power supply (PS2) 128. In the configuration of FIG. 1, first power supply 126 and second power supply 128 are implemented as redundant power supplies. For example, first power supply 126 may be implemented as the primary power supply while second power supply 128 acts as a backup/redundant power supply that becomes active upon loss of first power supply 126. Accordingly, the power supplies 126, 128 would be controlled to prevent both from being active at the same time. In exemplary embodiments, the power supplies 126, 128 would be controlled by a control signal from an interface, a field programmable gate array, a processor, a power on reset circuit, or some other external controller known to those having skill in the art. Thus, when the first power supply 126 is disabled, the control signal would turn on the second power supply 128.

The driver 102 comprises an electronics device powered by the second power supply 128 and is coupled to the optional connector 104 through a high-side signal line 122 and a low-side signal line 124. In the embodiment shown in FIG. 1, driver 102 comprises communication electronics that communicate to another device 130 over communication cable 132 using a differential signal transmitted across signal lines 122 and 124. Connector 104 comprises an interface (such as a plug or other termination devices) that physically and electrically couples signal lines 122 and 124 to signal lines within communication cable 132. In one embodiment, driver 102 comprises a transmitter that sends a differential signal across communication cable 132. In other embodiments, driver 102 comprises a receiver that receives a differential signal from communications cable 132. In alternate embodiments, the system 100 can be implemented using a differential signal standard such as LVDS, RS-422, RS-485, or other differential signal standards known to those in the art.

As shown in FIG. 1, biasing circuit 105 comprises a first current source 106 coupled to high-side signal line 122 and a second current source 108 coupled to low-side signal line 124. The second current source 108 is also coupled to ground. Both the first current source 106 and the second current source 108 are powered by the first power supply 126. This ensures that current sources 106, 108 are active at the same time, which forms a complete circuit to provide a biasing voltage and current to the signal lines 122, 124. In exemplary embodiments, the first current source 106 and the second current source 108 operate as switches. The current sources 106 and 108 may be implemented using various means. For example, in some embodiments, one or both of the current sources 106 and 108 comprise bipolar junction transistors. In other embodiments, the current sources are implemented using field-effect transistors, mechanical switches, mechanical relays, or a resistor network. In other embodiments, the current sources are implemented using another type of current source known to one having skill in the art.

The first current source 106 is also coupled to a high-precision voltage reference 110, which drives first current source 106 by providing a precise voltage to control the current supplied by the current source 106. In some exemplary embodiments, the high-precision voltage reference 110 is a Zener diode. In other embodiments, the high-precision voltage reference 110 is a resistor divider circuit. In other embodiments, the high-precision voltage reference 110 can be another type of precision voltage reference known to one having skill in the art. As indicated in FIG. 1, in some implementations, the high-precision voltage reference 110 may also be coupled to ground.

Biasing circuit 105 may also comprise one or more biasing and/or current limiting resistors such as shown by resistors 112, 114, 116, 118 and 120. For example, high-precision voltage reference 110 and current source 106 are each coupled to first power supply 126 via resistors 112 and 114 respectively. Current source 106 is coupled to high side signal line 122 by resistors 116. Current source 108 is coupled to first power supply 126 via resistor 120 and to low-side signal line 124 via resistors 118. While a pair of resistors is shown for resistors 116, 118, 120, it should be understood that each pair could be replaced with a single resistor.

In operation, communication system 100 operates with either the first power supply 126 powered or the second power supply 128 powered, but not both. When the first power supply 126 is energized, the biasing circuit 105 is powered on by the first power supply 126, and the voltage supplied to the first current source 106 is controlled by the high-precision voltage reference 110. Thus, when the first power supply 126 is powered on, the high-precision voltage reference 110 turns on the first current source 106. Since the driver 102 is powered by the second power supply 128, the driver 102 is not powered or active when the biasing circuit 105 is active. The high-side signal line 122 extending from the driver 102 to the optional connector 104 is coupled to the current source 106. Current source 106 provides a constant voltage and current to high-side signal line 122 through the optional connector 104, which sends the voltage and current through cable 132 to device 130 (which may be a receiver, for example). In exemplary embodiments, the ranges for the voltage and current vary depending on the system requirements. The voltage and current pass through a termination element (which may be a resistor, for example) in device 130, back to the optional connector 104 via cable 132, and to low-side signal line 124. The voltage and current pass through current source 108 to complete the circuit. It should be noted that current source 108 does not need to be operated to provide a voltage or a current to the low-side signal line 124. Instead, current source 108 acts as a switch to couple the low-side signal line 124 (and therefore the current pushed onto signal line 122 by current source 106) to a current sink (such as a system ground, for example).

In exemplary embodiments, system 100 shown in FIG. 1 is incorporated into a cross-strapped differential communication system that includes both a primary and a redundant side. In such embodiments, the primary side could be powered by the first power supply 126 and the redundant side could be powered by the second power supply 128. Since the driver 102 in FIG. 1 is powered by the second power supply 128, system 100, as shown in FIG. 1, would represent the transmitter of the redundant side of the cross-strapped differential communication system in such embodiments. The transmitter of the primary side would include an essentially identical schematic as that of system 100 shown in FIG. 1, with one difference. The first power supply 126 would power the driver 102 in the primary side, and the second power supply 128 would power the biasing circuit 105 in the primary side. As discussed above, the power supplies 126, 128 are not active at the same time. Since biasing circuit 105, in the redundant side, is coupled to the first power supply 126, the biasing circuit 105 would only be active when the primary driver was powered on. Similarly, the biasing circuit in the primary side would only be active when the driver 102 of the redundant side was powered on. This design ensures that the biasing circuits in the respective sides of the cross-strapped differential communication system do not interfere with the normal operation of the drivers.

Figure 2:
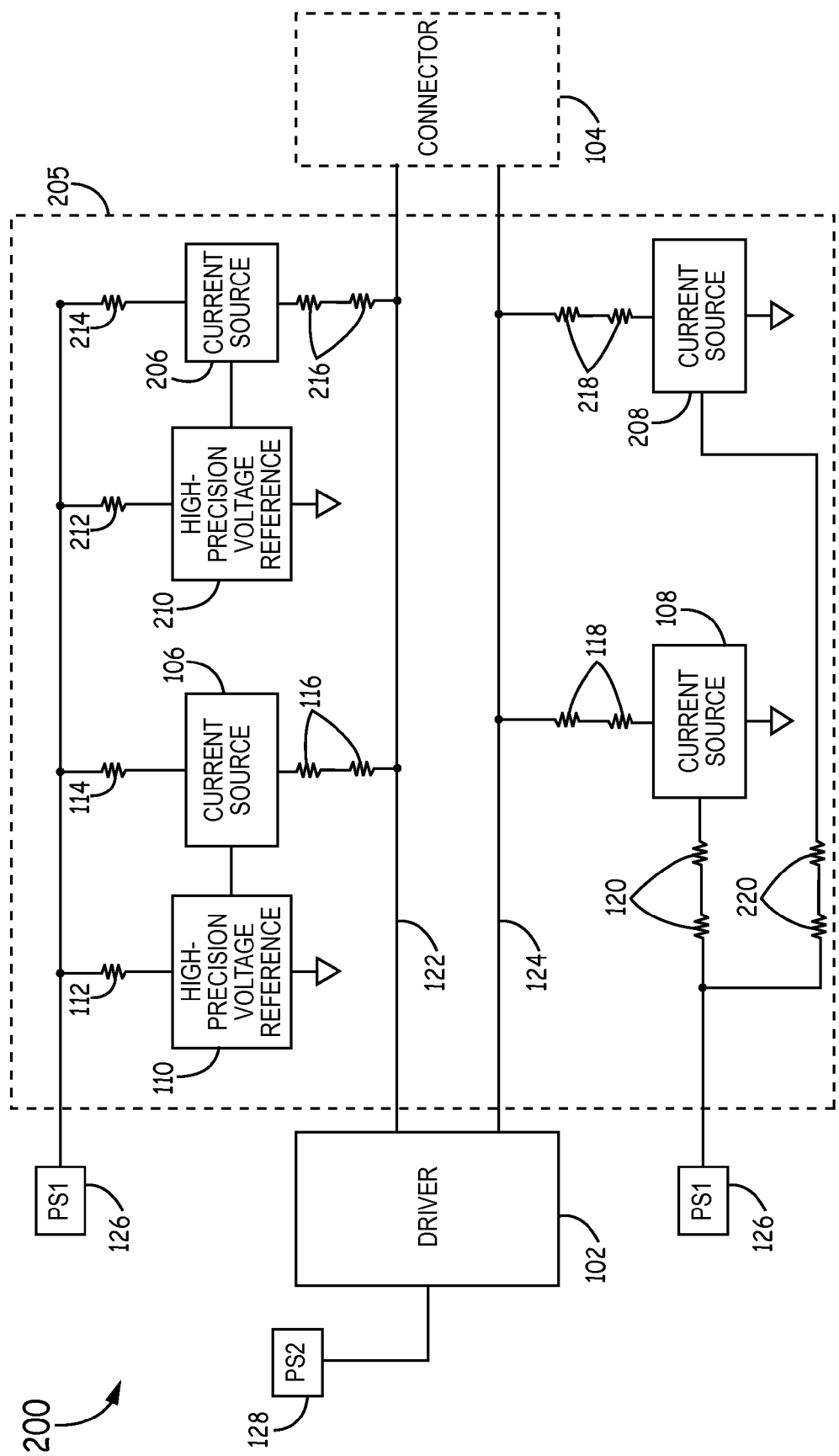
FIG. 2 is block diagram illustrating an example differential communication system according to one embodiment of the present disclosure.

FIG. 2 is a block diagram illustrating an example differential communication system 200 according to one embodiment of the present disclosure. System 200 includes a driver 102, an optional connector 104, a biasing circuit 205, a first power supply (PS1), and a second power supply (PS2). In exemplary embodiments, biasing circuit 205 includes four current sources 106, 108, 206, 208 and two high-precision voltage references 110, 210. Biasing circuit 205 may also comprise one or more biasing and/or current limiting resistors such as shown resistors 112, 114, 116, 118, 120, 212, 214, 216, 218, 220. The device 130 and connecting cable 132, shown in FIG. 1, are not shown in FIG. 2 for clarity purposes, but it should be understood that those components could be part of system 200. Similar to system 100, in some embodiments, system 200 can be implemented in a cross-strapped differential communication system.

Since system 200 is similar to system 100, only the differences will be discussed. However, it should be appreciated that like named and numbered elements discuss in FIG. 1 operate in the same manner with respect to FIG. 2 with the same options and alternatives, and vice versa. System 200 includes a second current source 206 coupled to the high-side signal line 122. Like current source 106, current source 206 is coupled to the first power supply 126 and the high-side signal line 122 through resistors 214, 216. Current source 206 is also coupled to a high-precision voltage reference 210. Current source 206 is connected to the first power supply 126 and the high-side signal line 122 in parallel with current source 106. Current source 206 and high-precision voltage reference 210 have characteristics similar to those of current source 106 and high-precision voltage reference 110, discussed above with respect to FIG. 1.

System 200 also includes a second current source 208 coupled to the low-side signal line 124. Like current source 108, current source 208 is also coupled to the first power supply 126 and the low-side signal line 124. Current source 208 is also coupled to a system ground. Current source 208 is connected to the first power supply 126 and a system ground in parallel with current source 108. Current source 208 has characteristics similar to those of current source 108, discussed above with respect to FIG. 1.

Since each current source 106, 108, 206, 208 is powered by the first power supply 126, the current sources 106, 108, 206, 208 will be active at the same time. When the current sources 106, 108, 206, 208 are active, this forms a complete circuit to provide a biasing voltage and current to the signal lines. When both current sources 106, 206 are operational, the current sources 106, 206 share the current and voltage that is provided to the high-side signal line 122. If there is a failure in one of the current sources 106, 206, the system 200 is capable of operation using the current source that is still operational. Thus, the specifications of the current sources 106, 206 and the high-precision voltage reference 110, 210 are determined based on the system 200 operating with a single current coupled to the high-side signal line 122.

Similarly, when both current sources 108, 208 are operational, the current sources 108, 208 share the current and voltage that is received from the low-side signal line 124. If there is a failure in one of the current sources 108, 208, the system 200 is capable of operation using the current source that is still operational. Thus, the specifications of the current sources 108, 208 are determined based on the system operating with a single current source on the high-side signal line 122.

Figure 3:
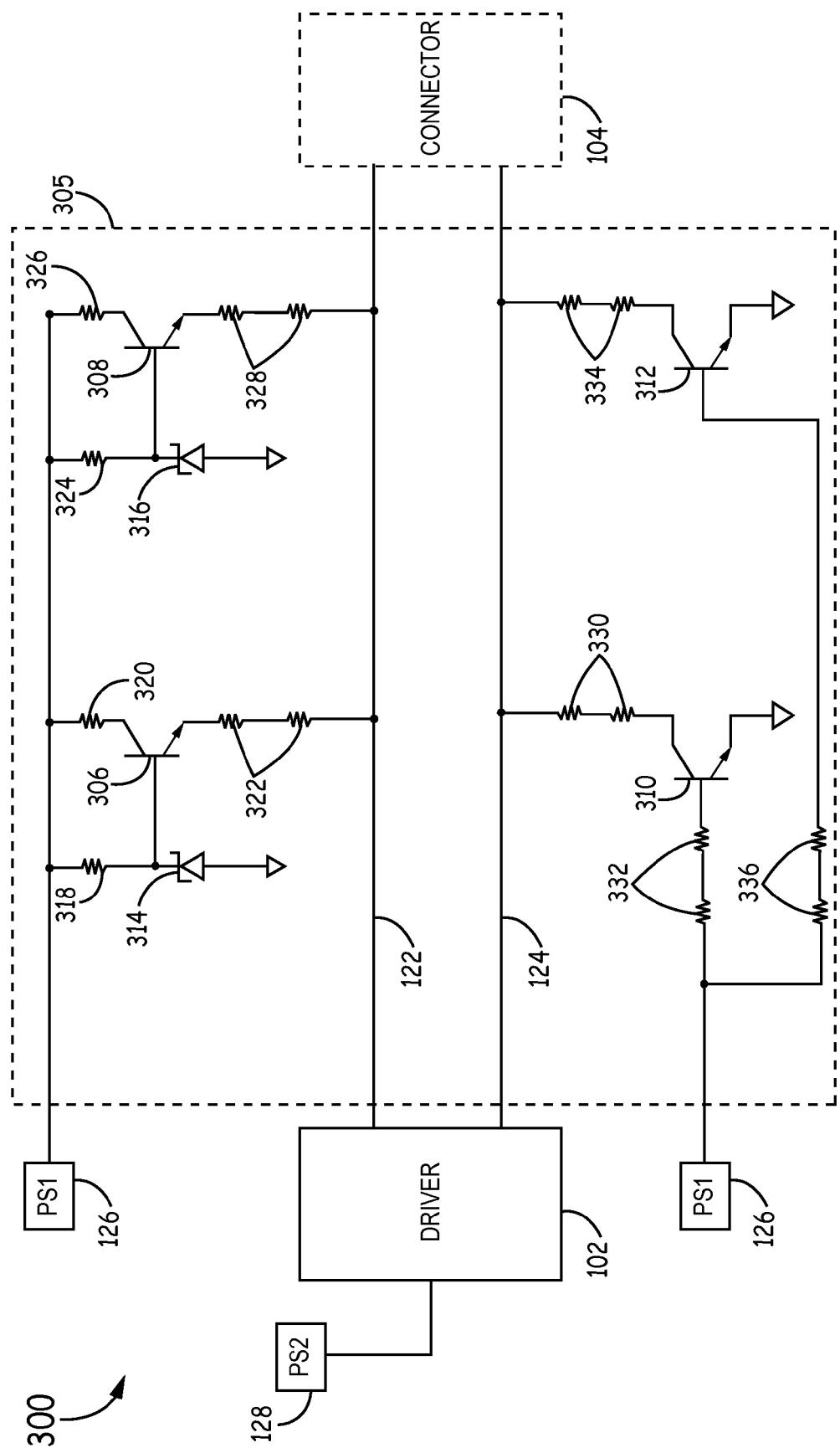
FIG. 3 is a block diagram illustrating an example differential communication system according to one embodiment of the present disclosure.

FIG. 3 is a block diagram illustrating an example differential communication system 300 according to one embodiment of the present disclosure. System 300 includes a driver 102, an optional connector 104, a biasing circuit 305, a first power supply (PS1), and a second power supply (PS2). Biasing circuit 305 comprises one example implementation of biasing circuit 205 illustration where the current sources may be implemented using transistors and the voltage references may be implemented using Zener diodes. In exemplary embodiments, biasing circuit 305 includes four transistors 306, 308, 310, 312 and two Zener diodes 314, 316.

Biasing circuit 305 may also comprise one or more biasing and/or current limiting resistors such as shown resistors 318, 320, 322, 324, 326, 328, 330, 332, 334, 336. The device 130 and connecting cable 132, shown in FIG. 1, are not shown in FIG. 3 for clarity purposes, but it should be understood that those components could be part of system 300. Similar to system 100, in some embodiments, system 300 can be implemented in a cross-strapped differential communication system.

The transistors 306, 308, 310, 312 in biasing circuit 305 are organized into pairs. The first pair of transistors includes transistors 306, 308 and the second pair of transistors includes transistors 310, 312. The first pair of transistors 306, 308 are connected to the first power supply 126 and the high-side signal line 122 in parallel. The second pair of transistors 310, 312 are connected to the low-side signal line 124 and a system ground in parallel. In exemplary embodiments, the transistors 306, 308, 310, 312 are NPN bipolar junction transistors. In other embodiments, the transistors 306, 308, 310, 312 are PNP bipolar junction transistors. While the transistors 306, 308, 310, 312 are shown as bipolar junction transistors in FIG. 3, it should be understood that different types of transistors could be used in biasing circuit 305. For example, the transistors 306, 308, 310, 312 could be metal-oxide-semiconductor field-effect transistors.

In exemplary embodiments, the minimum threshold values for the transistors 306, 308, 310, 312 are determined such that system 300 could continue to maintain operation within the operating range even with a single active transistor in each pair. Thus, although biasing circuit 305 is shown with four transistors 306, 308, 310, 312, in some embodiments, biasing circuit 305 would be capable of performing fail-safe biasing for system 300 with only one transistor from each pair. By organizing the transistors 306, 308, 310, 312 in parallel pairs and selecting appropriate minimum threshold values, biasing circuit 305 provides fault-tolerance in the event of a failure in one of the transistors 306, 308, 310, 312. In exemplary embodiments, biasing circuit 305 could also be configured to include more than four transistors.

The base of each transistor 306, 308 of the first pair is coupled to the cathode of a respective Zener diode 314, 316. The collector of each transistor 306, 308 in the first pair is coupled to the first power supply 126 through a resistor 320, 326. The emitter of each transistor 306, 308 in the first pair is coupled to the high-side signal line 122 through a pair of resistors 322, 328 connected in series. In exemplary embodiments, the transistors 306, 308 are biased to operate as switches.

The base of each transistor 310, 312 of the second pair is connected to the first power supply 126 through a pair of resistors 332, 336 that are connected in series. The collector of each transistor 310, 312 in the second pair is coupled to the low-side signal line 124 through a pair of resistors 330, 334 that are connected in series. The emitters of each transistor 310, 312 in the second pair is coupled to ground. The second pair of transistors 310, 312 are coupled to the low-side signal line 124 in order to complete the circuit through the signal lines 122, 124. In exemplary embodiments, the transistors 310, 312 are biased to operate as switches.

Some of the resistors 322, 328, 330, 332, 334, 336 are grouped in pairs in order to increase the fault-tolerance of the system. In exemplary embodiments, fault-tolerance is not required and the pairs of resistors are replaced by a single resistor. By organizing the resistors 322, 328, 330, 332, 334, 336 in pairs, a single shorted resistor will not hinder continued operation of the biasing circuit 305. The values of the resistors 318, 320, 322, 324, 326, 328, 330, 332, 334, 336 can be adjusted in order to change the voltage and current provided to the signal lines 122, 124. In exemplary embodiments, the value of the resistors 322, 328, 330, 334 is 324 ohms. In exemplary embodiments, the value of the resistors 320, 326 is 1 kilo-ohm. In exemplary embodiments, the value of the resistors 318, 324 is 4.99 kilo-ohms. In exemplary embodiments, the value of the resistors 332, 336 is 1.5 kilo-ohms.

The Zener diodes 314, 316 operate as a high-precision voltage reference/regulator for the transistors 306, 308. The anode of each Zener diodes 314, 316 is connected to a system ground. The cathode of each Zener diode 314, 316 is connected to the first power supply 126 through a resistor 318, 324 connected in series with the Zener diode 314, 316. The single resistors 318, 324 limit the current flow through the Zener diodes 314, 316.

The biasing circuit 305 is powered on by the first power supply 126. The voltage supplied to the base of transistors 306, 308 in the first pair is controlled by the Zener diodes 314, 316. Thus, when the first power supply 126 is powered on, it biases the Zener diodes 314, 316, which turn on the transistors 306, 308. Since Zener diodes provide a stabilized voltage output over time and varying load, Zener diodes provide a manageable way of ensuring that the voltage to the differential lines will be accurately known. In exemplary embodiments, the Zener diodes 314, 316 are set to provide 2.4 volts to the base of the transistors 306, 308, and the base-emitter voltage drop for the transistors 306, 308 is approximately 0.7 volts. When the first power supply 126 is powered on, this also turns on the transistors 310, 312.

When all transistors are operational, transistors 306, 308 current share and transistors 310, 312 current share. When the biasing circuit 305 is active, transistors 306, 308 provide a constant voltage and current to the high-side signal line 122, which extends from the driver 102 to the optional connector 104. The constant voltage and current is provided through the optional connector 104, which sends the voltage and current to the device 130 through cable 132. The voltage and current pass through the termination resistor in the device 130 and back to the optional connector 104 through cable 134. The voltage and current pass through the second pair of transistors 310, 312 to a system ground complete the circuit.

Figure 4:
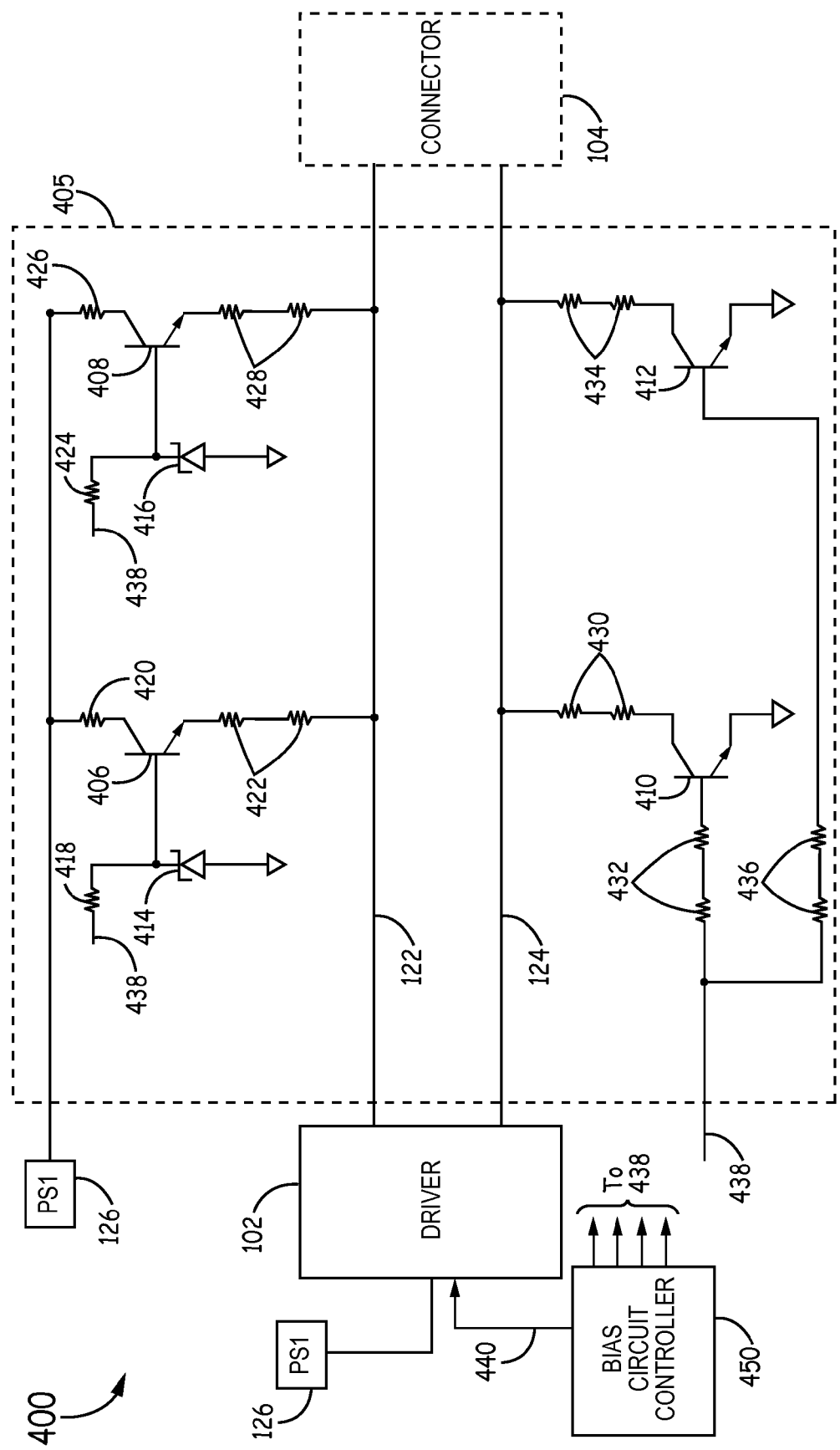
FIG. 4 is a block diagram illustrating an example differential communication system according to one embodiment of the present disclosure.

FIG. 4 is a block diagram illustrating an example differential communication system 400 according to one embodiment of the present disclosure. System 400 includes a driver 102, an optional connector 104, a biasing circuit 405, and a first power supply (PS1) 126. In exemplary embodiments, biasing circuit 405 includes four transistors 406, 408, 410, 412; two Zener diodes 414, 416; and a plurality of resistors 418, 420, 422, 424, 426, 428, 430, 432, 434, 436. The device 130 and connecting cable 132 are not shown in FIG. 4 for clarity purposes, but it should be understood that those components could be part of system 400. In some embodiments, system 400 is implemented in a high-reliability, single-stream differential communication system.

System 400 functions similarly to system 300 with one major difference. System 300 is implemented using two different (and redundant) power supplies, whereas system 400 only includes a single power supply. Since the driver 102 and the biasing circuit 405 are both powered by the first power supply 126, system 400 includes a different mechanism for engaging the biasing circuit 405 to ensure that the driver 102 and the biasing circuit 405 are not active at the same time. As discussed above, it is undesirable to have the biasing circuit active at the same time as the driver because the biasing circuit will interfere with the normal operation of the driver.

The operation of the components of system 400 is similar to that of the components in system 300, so only the differences between the systems will be discussed. It should therefore be understood that the variations discussed above with reference to system 300 would also apply to system 400.

The driver 102 and the transistors 406, 408 are connected to the first power supply 126. In order to prevent the biasing circuit 405 from interfering with the normal operation of the driver 102, system 400 includes a bias circuit controller 450 to enable or disable the biasing circuit 405 and the driver 102. In exemplary embodiments, the bias circuit controller 450 may comprise, for example, a field programmable gate array, a processor, a power on reset circuit, or some other external controller known to those having skill in the art.

Bias circuit controller 450 provides logic level signals 438 to enable/disable the transistors 406, 408, 410, 412. When the transistors 406, 408, 410, 412 are enabled by bias circuit controller 450, the biasing circuit 405 is activated. When the biasing circuit 405 is active, the Zener diodes 416, 418 are biased in a manner similar to that discussed above with reference to FIG. 3. Since biasing circuit 405 should only be active when the driver 102 is not operating, the logic level signal 440 provided to the driver 102 will be opposite the logic level signals 438 provided to the transistors 406, 408, 410, 412. Thus, proper operation of system 400 requires that the bias circuit controller 450 ensure that the transistors 406, 408, 410, 412, are in an opposite state compared to the driver 102.

In exemplary embodiments, the bias circuit controller 450, discussed above with reference to system 400 could be utilized in any implementation of the systems 100, 200 and 300 as well. Utilization of such a controller may be beneficial in situations where a higher level of control over the biasing circuit 104, 205, 305 is desired.

The biasing circuits 105, 205, 305, 405 discussed above with reference to FIGS. 1-4 can be used to replace the fail-safe bias resistors that are not always effective for providing adequate noise margins for single-stream differential communication systems that experience noise. The biasing circuits 105, 205, 305, 405 prevent the receiver from autonomously switching due to noise coupling on the cables because the biasing circuits 105, 205, 305, 405 provide a voltage and current to maintain the signal to the receiver when the cables are not being actively driven.

Further, the biasing circuits 105, 205, 305, 405 do not inhibit performance of the driver that is active because the biasing circuit is only engaged when the driver is inactive. For biasing circuits 105, 205, 305, this is ensured because the biasing circuit and the drivers are activated by different power supplies. For biasing circuit 405, a controller can be used to control the biasing circuit 405 and the driver 102 to ensure that the biasing circuit 405 is not powered on when the driver is operational. Thus, biasing circuits 105, 205, 305, 400 provide a significant advantage over prior systems that employed fail-safe bias resistors because they will not interfere with the normal operation of the drivers.

Figure 5:
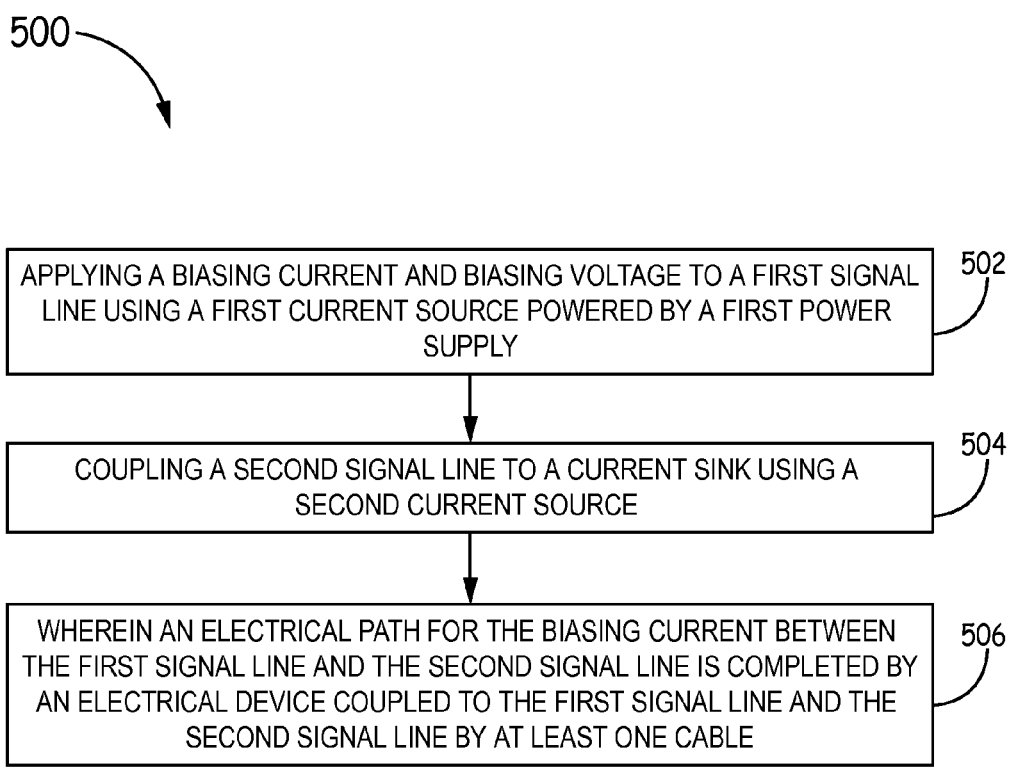
FIG. 5 is a flow chart illustrating a method of increasing noise margins of a differential communication system according to one embodiment of the present disclosure.

FIG. 5 is a flow chart illustrating a method 500 for providing fail-safe biasing to a differential communication system, such as differential communication systems 100, 200, 300, 400.

The method begins at 502 with applying a biasing current and biasing voltage to a first signal line using a first current source powered by a first power supply. In one embodiment, applying the biasing current and biasing voltage to the first a signal line may further include turning on the first current source with a voltage from a first high-precision voltage reference that is biased when the first power supply is turned on. In that case, the method at 502 may further include regulating the biasing current by driving the first current source with a high-precision voltage reference, wherein the high-precision voltage reference is also powered by the first power supply.

The first current source may be coupled between the first signal line and the first power supply. In other exemplary embodiments, applying the biasing current and biasing voltage further includes providing a logic level signal to the first current source. In exemplary embodiments, the logic level signal is provided by a controller, such as the bias circuit controller 450 discussed above with reference to FIG. 4.

The method proceeds to 504 with coupling a second signal line to a current sink using a second current source powered by the first power supply. In one embodiment, coupling the second signal line may further comprise turning on the second current source with a voltage from the first power supply. The second current source may be coupled between the second signal line and a current sink (such as, for example, a system ground). In exemplary embodiments, coupling the second signal line to the current sink further includes providing a logic level signal to the second current source. In exemplary embodiments, the logic level signal is provided by a controller, such as the bias circuit controller 450 discussed above with reference to FIG. 4.

The method then proceeds to 506 wherein an electrical path for the biasing current between the first signal line and the second signal line is completed by an electrical device coupled to the first signal line and the second signal line by at least one cable. As discussed above, a differential signal driver is coupled to the first signal line and the second signal line and configured to transmit a differential signal across the first signal line and the second signal line. In some embodiments, the differential signal driver is coupled to a second power supply, wherein the second power supply is de-energized whenever the first power supply is energized and vice versa. In that case, the biasing current through the first signal line and the second signal line is applied only when the first power supply is energized. This provides a biasing signal to the external electrical device such that noise on the cable (which may occur when the differential signal driver is not in operation) becomes negligible as compared to the biasing signal.

As discussed above, when the first power supply is energized, the first current source is powered on by the first power supply, and the voltage supplied to the first current source may be controlled by a high-precision voltage reference. In that case, when the first power supply is powered on, the high-precision voltage reference turns on the first current source. The voltage and current pass through a termination element (which may be a resistor, for example) in the electrical device to second signal line. The voltage and current pass through second current source to the current sink to complete the circuit.

In other embodiments, additional current sources may be included to provide fault tolerance. In such embodiments, a third current source may be coupled between the first signal line and the first power supply in parallel with the first current source. Also, the second signal line may be coupled to the current sink using a fourth current source powered by the first power supply and connected in parallel with the second current source. The first current source and the third current source are configured to provide a portion of the biasing current and biasing voltage applied to the first signal line. The second current source and the fourth current source are configured to receive a portion of the voltage and current from the second signal line. In exemplary embodiments, the third current source and the fourth current source have characteristics similar to the first and second current sources respectively.

In some embodiments, the fail-safe biasing is performed in the transmitter of the differential communication system. In such embodiments, the biasing current and the biasing voltage are transmitted to the receiver of the differential communication system. In other embodiments, the fail-safe biasing is performed in the receiver of the differential communication system.

Example Embodiments

Example 1 includes a transmitter of a differential communication system, comprising: a differential signal driver coupled to a first power supply; a differential line comprising a first signal line and a second signal line; a fail-safe biasing circuit coupled to a second power supply, including: a first current source coupled between the second power supply and the first signal line; a first high-precision voltage reference directly coupled to the first current source, wherein the first high-precision voltage reference outputs a reference voltage that drives a current produced by the first current source; and a second current source coupled to the second signal line and a current sink, wherein the second current source is driven by a voltage supplied by the second power supply.

Example 2 includes the differential communication system of Example 1, wherein the fail-safe biasing circuit further includes: a third current source coupled between the second power supply and the first signal line, wherein the third current source is connected to the second power supply and the first signal line in parallel with the first current source; a second high-precision voltage reference directly coupled to the third current source, wherein the second high-precision voltage reference outputs a reference voltage that drives a current produced by the third current source; and a fourth current source coupled to the second signal line and a system ground, wherein the fourth current source, wherein the fourth current source is driven by a voltage supplied by the second power supply, wherein the fourth current source is connected to the second power supply and the second signal line in parallel with the second current source.

Example 3 includes the differential communication system of any of Examples 1-2, wherein the first current source and the second current source are each selected from a group consisting of: a field-effect transistor; a mechanical switch; a mechanical relay; and a resistor network.

Example 4 includes the differential communication system of Example 1-3, wherein the first high-precision voltage reference is selected from a group consisting of: a Zener diode; and a resistor divider circuit.

Example 5 includes the differential communication system of any of Examples 1-4, wherein the system is configured so only one of the first power supply and the second power supply are powered on at a time.

Example 6 includes a biasing circuit, the circuit comprising: a differential communication line comprising a first signal line and a second signal line; a first current source coupled between a power supply and the first signal line; a first high-precision voltage reference coupled to the first current source, wherein the first high-precision voltage reference outputs a reference voltage that drives a current produced by the first current source; and a second current source coupled to the second signal line and a system ground.

Example 7 includes the biasing circuit of Example 6, further comprising: a third current source coupled between the power supply and the first signal line, wherein the third current source is connected to the power supply and the first signal line in parallel with the first current source; a second high-precision voltage reference coupled to the third current source, wherein the second high-precision voltage reference outputs a reference voltage that drives a current produced by the third current source; and a fourth current source coupled to the second signal line and a system ground, wherein the second current source and the fourth current source are driven by a voltage supplied by the power supply.

Example 8 includes the biasing circuit of Example 7, wherein the first current source, the second current source, the third current source, and the fourth current source are each selected from a group consisting of: a field-effect transistor; a mechanical switch; a mechanical relay; and a resistor network.

Example 9 includes the biasing circuit of Example 7, wherein the first high-precision voltage reference and the second high-precision voltage reference each comprise a Zener diode.

Example 10 includes the biasing circuit of any of Examples 6-9, wherein the biasing circuit is implemented in a transmitter of a differential communication system.

Example 11 includes the biasing circuit of any of Examples 6-10, wherein the biasing circuit is implemented in a receiver of a differential communication system.

Example 12 includes the biasing circuit of any of Examples 6-11, wherein the biasing circuit is implemented in both a primary side and a redundant side of a cross-strapped, differential communication system.

Example 13 includes the biasing circuit of any of Examples 6-12, wherein the biasing circuit is implemented in a single-stream differential communication system.

Example 14 includes the biasing circuit of Example 6-13, further comprising a controller configured to provide logic level signals to enable or disable the first current source and the second current source, wherein the second current source is driven by a voltage supplied by the controller.

Example 15 includes a method of providing fail-safe biasing for a differential communication system, comprising: applying a biasing current and biasing voltage to a first signal line using a first current source powered by a first power supply; coupling a second signal line to a current sink using a second current source; wherein an electrical path for the biasing current between the first signal line and the second signal line is completed by an electrical device coupled to the first signal line and the second signal line by at least one cable.

Example 16 includes the method of Example 15, wherein applying the biasing current and biasing voltage further includes providing a first logic level signal, with a controller, to enable the first current source; and wherein coupling the second signal line to the current sink further includes providing a second logic level signal, with the controller, to enable the second current source.

Example 17 includes the method of any of Examples 15-16, wherein applying the biasing current and biasing voltage to a first signal line further includes using a third current source powered by the first power supply; and wherein coupling the second signal line to the current sink further includes using a fourth current source, wherein the second current source and the fourth current source are powered by the first power supply.

Example 18 includes the method of Example 17, further comprising: coupling the first current source and the third current source in parallel so both the first current source and the third current source are configured to provide a portion of the biasing current and biasing voltage to the first signal line; and coupling the second current source and the fourth current source in parallel so both the second current source and the fourth current source are configured to receive a portion of a current and a voltage from the second signal line.

Example 19 includes the method of any of Examples 15-18, further comprising regulating the biasing current by driving the first current source with a high-precision voltage reference, wherein the high-precision voltage reference is also powered by the first power supply.

Example 20 includes the method of any of Examples 15-19, wherein a differential signal driver is coupled to the first signal line and the second signal line and configured to transmit a differential signal across the first signal line and the second signal line, wherein the differential signal driver is coupled to a second power supply, wherein the second power supply is de-energized whenever the first power supply is energized.

In various alternative embodiments, system elements, method steps, or examples described throughout this disclosure (such as the bias circuit controller, for example) may be implemented on one or more computer systems, field programmable gate array (FPGA), or similar devices comprising a processor executing code to realize those elements, processes, or examples, said code stored on a non-transient data storage hardware device. Therefore other embodiments of the present disclosure may include elements comprising program instructions resident on computer readable media which when implemented by such computer systems, enable them to implement the embodiments described herein. As used herein, the term "computer readable media" refers to tangible memory storage devices having non-transient physical forms. Such non-transient physical forms may include computer memory devices, such as but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device having a physical, tangible form. Program instructions include, but are not limited to computer-executable instructions executed by computer system processors and hardware description languages such as Very High Speed Integrated Circuit (VHSIC) Hardware Description Language (VHDL).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A transmitter of a differential communication system, comprising:
 a differential signal driver coupled to a first power supply;

a differential line coupled to the differential signal driver, wherein the differential line comprises a first signal line and a second signal line;
a fail-safe biasing circuit coupled to a second power supply, including:
a first current source coupled between the second power supply and the first signal line;
a first high-precision voltage reference directly coupled to the first current source, wherein the first high-precision voltage reference outputs a reference voltage that drives a current produced by the first current source; and
a second current source coupled to the second signal line and a current sink, wherein the second current source is driven by a voltage supplied by the second power supply.

2. The differential communication system of claim 1, wherein the fail-safe biasing circuit further includes:
a third current source coupled between the second power supply and the first signal line, wherein the third current source is connected to the second power supply and the first signal line in parallel with the first current source;
a second high-precision voltage reference directly coupled to the third current source, wherein the second high-precision voltage reference outputs a reference voltage that drives a current produced by the third current source; and
a fourth current source coupled to the second signal line and a system ground, wherein the fourth current source is driven by a voltage supplied by the second power supply, wherein the fourth current source is connected to the second power supply and the second signal line in parallel with the second current source.

3. The differential communication system of claim 1, wherein the first current source and the second current source are each selected from a group consisting of:
a field-effect transistor;
a mechanical switch;
a mechanical relay; and
a resistor network.

4. The differential communication system of claim 1, wherein the first high-precision voltage reference is selected from a group consisting of:
a Zener diode; and
a resistor divider circuit.

5. The differential communication system of claim 1, wherein the system is configured so only one of the first power supply and the second power supply are powered on at a time.

6. A biasing circuit, the circuit comprising:
a differential communication line comprising a first signal line and a second signal line;
a first current source coupled between a power supply and the first signal line;
a first high-precision voltage reference coupled to the first current source, wherein the first high-precision voltage reference outputs a reference voltage that drives a current produced by the first current source; and
a second current source coupled to the second signal line and a system ground.

7. The biasing circuit of claim 6, further comprising:
a third current source coupled between the power supply and the first signal line, wherein the third current source is connected to the power supply and the first signal line in parallel with the first current source;
a second high-precision voltage reference coupled to the third current source, wherein the second high-precision voltage reference outputs a reference voltage that drives a current produced by the third current source; and
a fourth current source coupled to the second signal line and a system ground, wherein the second current source and the fourth current source are driven by a voltage supplied by the power supply.

8. The biasing circuit of claim 7, wherein the first current source, the second current source, the third current source, and the fourth current source are each selected from a group consisting of:
a field-effect transistor;
a mechanical switch;
a mechanical relay; and
a resistor network.

9. The biasing circuit of claim 7, wherein the first high-precision voltage reference and the second high-precision voltage reference each comprise a Zener diode.

10. The biasing circuit of claim 6, wherein the biasing circuit is implemented in a transmitter of a differential communication system.

11. The biasing circuit of claim 6, wherein the biasing circuit is implemented in a receiver of a differential communication system.

12. The biasing circuit of claim 6, wherein the biasing circuit is implemented in both a primary side and a redundant side of a cross-strapped, differential communication system.

13. The biasing circuit of claim 6, wherein the biasing circuit is implemented in a single-stream differential communication system.

14. The biasing circuit of claim 6, further comprising a controller communicatively coupled to the first current source and the second current source, wherein the controller is configured to provide logic level signals to enable or disable the first current source and the second current source, wherein the second current source is driven by a voltage supplied by the controller.

15. A method of providing fail-safe biasing for a differential communication system, comprising:
applying a biasing current and biasing voltage to a first signal line using a first current source powered by a first power supply;
regulating the biasing current by driving the first current source with a high-precision voltage reference;
coupling a second signal line to a current sink using a second current source;
wherein an electrical path for the biasing current between the first signal line and the second signal line is completed by an electrical device coupled to the first signal line and the second signal line by at least one cable.

16. The method of claim 15, wherein applying the biasing current and biasing voltage further includes providing a first logic level signal, with a controller, to enable the first current source;
wherein coupling the second signal line to the current sink further includes providing a second logic level signal, with the controller, to enable the second current source; and
wherein the controller is communicatively coupled to the first current source and the second current source.

17. The method of claim 15, wherein applying the biasing current and biasing voltage to a first signal line further includes using a third current source powered by the first power supply; and wherein coupling the second signal line to the current sink further includes using a fourth current source, wherein the second current source and the fourth current source are powered by the first power supply.

18. The method of claim 17, further comprising:

coupling the first current source and the third current source in parallel so both the first current source and the third current source are configured to provide a portion of the biasing current and biasing voltage to the first signal line; and coupling the second current source and the fourth current source in parallel so both the second current source and the fourth current source are configured to receive a portion of a current and a voltage from the second signal line.

19. The method of claim 15, wherein the high-precision voltage reference is also powered by the first power supply.

20. The method of claim 15, wherein a differential signal driver is coupled to the first signal line and the second signal line and configured to transmit a differential signal across the first signal line and the second signal line, wherein the differential signal driver is coupled to a second power supply, wherein the second power supply is de-energized by a controller whenever the first power supply is energized, wherein the controller is communicatively coupled to the first power supply and the second power supply.

\* \* \* \* \*